United States Patent [19]

Takahashi et al.

[11] 4,413,309
[45] Nov. 1, 1983

[54] PRINTED CIRCUIT BOARD

[75] Inventors: Toshio Takahashi, Tokyo; Mitsuo Ohsawa, Chigasaki, both of Japan

[73] Assignee: Sony Corporation, Tokyo, Japan

[21] Appl. No.: 281,422

[22] Filed: Jul. 8, 1981

[30] Foreign Application Priority Data

Jul. 17, 1980 [JP] Japan ............... 55/101141[U]

[51] Int. Cl.³ ............................................. H05K 1/02
[52] U.S. Cl. ................................. 361/406; 174/68.5; 361/400; 361/409; 228/180 A
[58] Field of Search ............... 361/400, 402, 406, 409; 174/68.5; 228/39, 180 R, 180 A

[56] References Cited

U.S. PATENT DOCUMENTS

| | | | |
|---|---|---|---|
| 3,431,350 | 3/1969 | Haberecht | 361/400 X |
| 3,610,811 | 10/1971 | O'Keefe | 361/409 X |
| 3,621,116 | 11/1971 | Adams | 361/409 X |
| 3,805,117 | 4/1974 | Hausman | 361/400 X |
| 3,859,722 | 1/1975 | Kinsky et al. | 228/259 X |
| 4,139,881 | 2/1979 | Shimizu et al. | 361/406 X |
| 4,288,840 | 9/1981 | Konishikawa et al. | 361/406 X |
| 4,316,320 | 2/1982 | Nogawa et al. | 228/180 A X |

OTHER PUBLICATIONS

Allen et al., Solder Mask Process, IBM Tech. Disc. Bull., vol. 4 #2, Jul. 1961, p. 9.

Primary Examiner—R. R. Kucia
Attorney, Agent, or Firm—Hill, Van Santen, Steadman & Simpson

[57] ABSTRACT

A printed circuit board substrate is mounted with electric circuit components to form an electric circuit thereon. The printed circuit board is provided with a land without a piercing hole for electrical connection with an electrode of a chip-shaped leadless element, and a land with an aperture for the insertion of the lead wire of a component or element with a lead, and further a pilot pattern for leading melted solder in spite of the presence of evaporated solder flux gas or air during a solder dipping operation. The pilot pattern may comprise a conductive pattern connecting the land for the leadless element and the land for the element with lead. At least elimination of the solder resist layer on a portion of the conductive pattern to form the pilot pattern.

4 Claims, 7 Drawing Figures

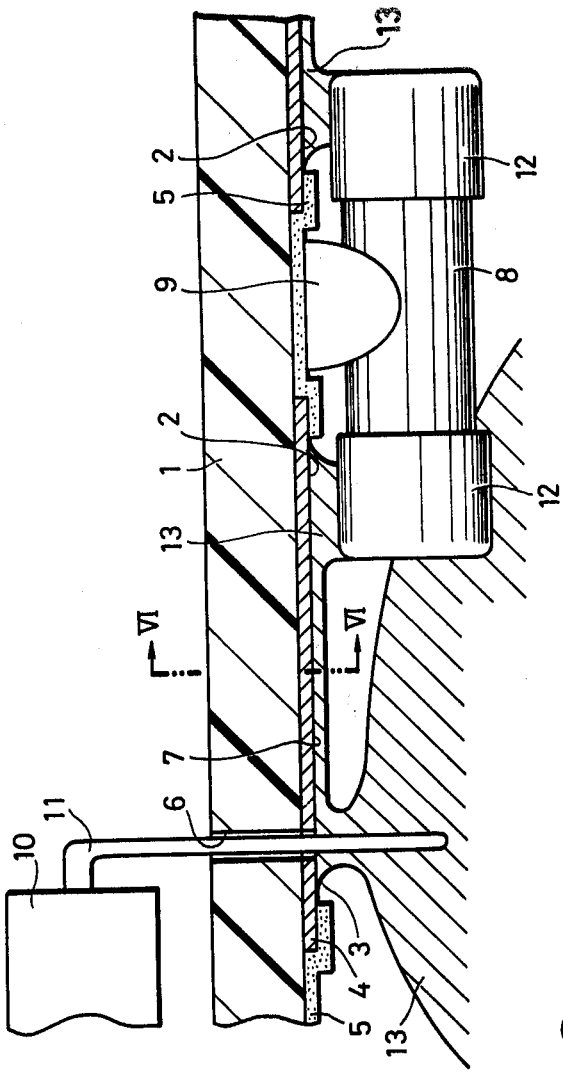

PRINTED CIRCUIT BOARD

BACKGROUND OF THE INVENTION

1. Field of the Invention:

This invention relates to a printed circuit board for mounting circuit elements to form an electric circuit thereon.

2. Description of the Prior Art:

It has been proposed to provide a hybrid integrated circuit for minimizing an electric circuit and for more effectively producing an electric circuit. Such a hybrid integrated circuit is obtained by temporarily mounting chip-shaped leadless elements on the board through adhesive resin and then electrically connecting the electrodes of the leadless elements with the lands of the printed circuit board through a solder dipping operation. On this solder dipping operation, solder flux is evaporated, and flux gas is generated. During the solder dipping operation for areas with leads, the evaporated gas escapes upwardly through piercing holes formed in the circuit board for the insertion of the lead wires, and hence the gas is not trapped in the dipping position. However, in the solder dipping operation for leadless elements, the gas has no escape and stays in the shade of the elements, because piercing holes are not formed on the portions where leadless elements are to be mounted. Further, the air staying near the elements has its escape cut off. The evaporated gas or the air acts to prevent melted solder from extending into the surface of the electrodes. Accordingly, the electrodes of the leadless elements are not connected to the lands of the circuit board with certainty. When mounting density of the elements is high or many leadless elements are closely mounted on the board substrate, the above mentioned problem is serious. To solve the above mentioned problem, it has been proposed to form piercing holes on the lands or areas intended for a leadless element, or near the lands to permit the escape of the gas or the air. However, this proposed method increases the number of the process for manufacturing the printed circuit board, and still more the method requires additional dies for piercing holes or increases the cost of the existing dies.

OBJECTS AND SUMMARY OF THE INVENTION

Accordingly, it an object of the present invention to provide an improved printed circuit board which is free from the above defects associated with the conventional printed circuit board.

Another object of this invention is to provide a printed circuit board the conductive lands of which are surely connected electrically to electrodes of leadless elements.

A further object of this invention is to provide a printed circuit board which is provided with pilot patterns for leading melted solder to the position between the land and the electrode of a leadless element during the solder dipping operation.

A still further object of this invention is to provide a printed circuit board with pilot patterns which does not increase the number of processes for manufacturing the printed circuit board and does not require further materials, and further does not increase the cost of the printed circuit board.

A still further object of this invention is to provide a printed circuit board, wherein the percentage of poor quality electric circuits formed thereon is much decreased.

In accordance with one aspect of this invention, a printed circuit board is provided for mounting circuit elements to form an electric circuit, said circuit board comprising:

a land or conductive area without a piercing hold for connecting with an electrode of a leadless element;

a raised land with a piercing hole for connecting with a lead wire of a component with leads; and a pilot pattern connecting said land area for a leadless element and said land for an element with leads, for leading melted solder from the latter to the former.

The above, and other objects, features and advantages of the invention will be apparent from the following detailed description of an illustrative embodiment which is to be read in connection with the accompanying drawings.

BRIEF DESCRIPTION OF THE DRAWINGS

FIG. 5 is a partial cross section of the printed circuit board in which circuit elements have been mounted and which is subjected to solder dipping;

FIG. 6 is a cross section taken along a line VI—VI in FIG. 5; and

DESCRIPTION OF THE PREFERRED EMBODIMENTS

Figure 1:
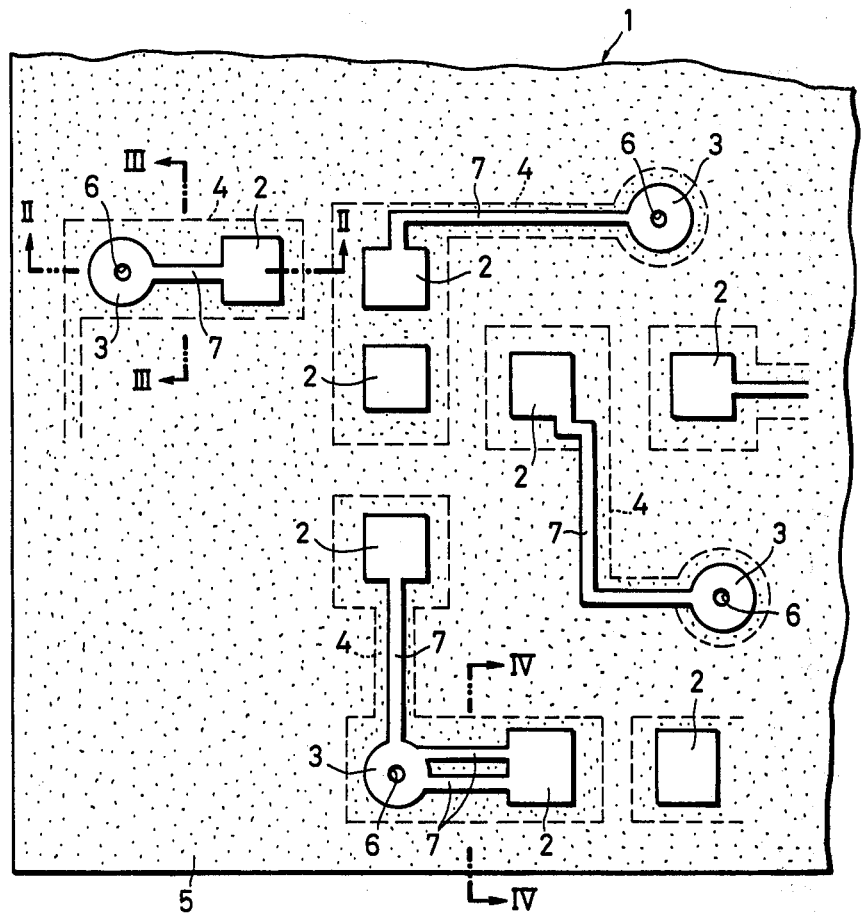
FIG. 1 is a plan view of a printed circuit board according to a first embodiment of this invention.
Figure 2:
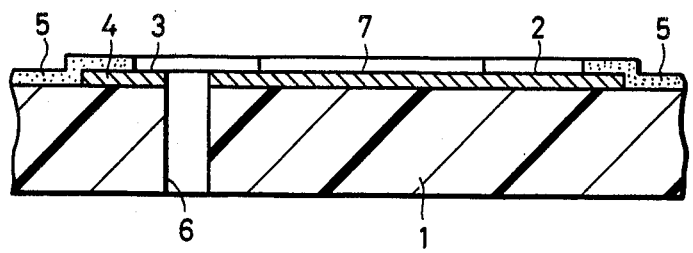
FIG. 2 is a cross section taken along a line II—II in FIG. 1.

FIG. 1 to FIG. 6 illustrate a printed circuit board 1 according to a first embodiment of this invention. In this circuit board 1, chip-shaped leadless circuit elements and circuit elements with leads are mounted for forming an electric circiut on a conventional dielectric substrate. For this purpose, raised lands 2 for leadless elements and lands 3 for elements with leads are formed on the substrate of circuit board 1. The lands 2 and 3 are comprised of conductive patterns 4 which are formed by chemically etching a copper foil adhered on the circuit board 1 to leave predetermined portions of the foil. A solder-resist layer 5 is formed on the conductive patterns 4, while some portions of the patterns 4 are not covered by the layer 5 so that the patterns 4 are partially exposed for forming the lands 2 and 3. Piercing holes 6 are formed on the lands 3 for elements intended to have leads to receive lead wires thereof at the centers of the lands 3 as shown specially in FIG. 2. On the other hand, the lands 2 for leadless elements do not have piercing holes.

Figure 3:
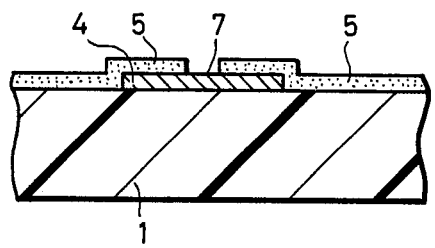
FIG. 3 is a cross section taken along a line III—III in FIG. 1.
Figure 4:
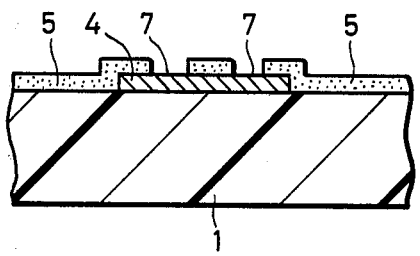
FIG. 4 is a cross section taken along a line IV—IV in FIG. 1.

A pilot or leader pattern 7 is formed between the land 2 for leadless element and the land 3 intended for the element with leads. The pilot pattern 7 is comprised of a conductive pattern 4 made of copper foil connecting the lands 2 and 3 to each other. That is, for example, a central portion of the conductive pattern 4 is not covered with the resist layer 5, as shown in FIG. 3, and a disposed strip 7 of conductive pattern 4 is formed, when a resist layer 5 is formed on the pattern 4. Therefore, the pilot pattern 4 is formed by merely changing a pattern of a screen for printing the solder resist material, and hence the pilot pattern 4 does not cause an increase in the number of process steps to thereby increase material and cost. While the pilot pattern 7 is made of singular conductive strip in FIG. 3, the pilot pattern 7 may be made of plural strips, for example, a pair of strips which are parallel to each other as shown in FIG. 1 and FIG. 4, so far as the pair of disposed strips 7 are connected to both the land 2 for leadless element and the land 3 for element with leads.

In mounting circuit elements on the above mentioned circuit board 1, the chip-shaped or similar leadless elements 8 are temporarily mounted on the board 1 by means of adhesive resin 9 which connects the body portion of the elements 8 and the circuit board 1 as shown in FIG. 5, while the elements 10 with leads are temporarily mounted by means of the lead wires 11 which are inserted into the piercing holes 6. Then the circuit board 1 with the leadless elements 8 and elements 10 with leads temporarily mounted thereon is transported to a solder dipping bath in such a manner that the surface with conductive patterns 4 thereon is positioned facing down.

Through the solder dipping operation, a pair of electrodes 12 of the leadless component or element 8 are connected to respective lands 2, and the lead wire 11 of the elements 10 with leads is connected to the land 3, to thereby form a predetermined electric circuit. In this solder dipping operation, the melted solder 12 is led by the pilot pattern 7 into the portion between the electrode 12 of the element 8 and the land 2, whereby the electrode 12 and the land 2 are surely connected electrically each other.

Thus describing the above function of the pilot pattern 7, solder flux evaporates during the solder dipping operation and evaporated gas is apt to remain next to the leadless element 8, and further air staying adjacent the element 8 has its escape cut off, because the land 2 for the leadless element 8 does not have a piercing hole. The evaporated gas or the air staying on and adjacent to the element 8 prevents the melted solder from being put into the portion between the land 2 and the electrode 12. On the other hand, melted solder is easily adhered to the land 3, and the lead wire 11 of the element 10 is surely connected to the land 3, because the land 3 has a piercing hole 6 for escapement of the gas or air. The melted solder is led from the land 3 to the land 2 through the pilot pattern 7 as shown in FIG. 6, and thusly led solder is put into the portion between the land 2 and the electrode 12 as shown in FIG. 5, to thereby connect electrically the land 2 and the electrode 12 to each other. That is according to the printed circuit board of this embodiment, the melted solder 13 is led through the pilot pattern 7 from the land 3 for element with lead where the gas or the air escapes through the hole 6 to the land 2 for leadless element where the gas or the air is apt to stay. Accordingly, the electrode 12 of the leadless element 8 is surely connected to the land 2 having no piercing hole through the solder 13.

Still more, as the width of the pilot pattern 7 is narrower than the length of a side of the land 2, the solder 13 adhered on the pilot pattern 7 is not bridged with the solder of other portions. For this reason, mistaken wiring is prevented.

Figure 7:
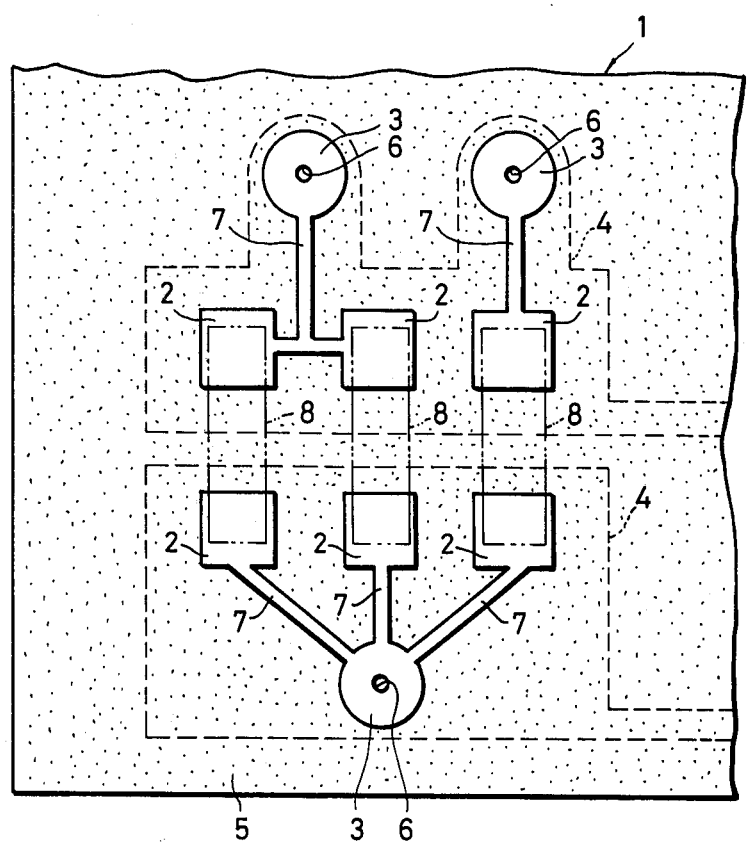
FIG. 7 is a plan view of a printed circuit board according to a second embodiment of this invention.

FIG. 7 shows a circuit board according to the second embodiment of this invention. In this embodiment, the portion corresponding to that of the first embodiment is denoted by the same reference numeral and the description of the structure same as that of the first embodiment is omitted. The feature of this embodiment is that a singular and a common land 3 for an element with a lead, is connected to plural, for example three lands 2 for leadless elements through respective pilot or solder leading patterns 7. By this arrangement, a singular land 3 for element with lead is more effectively utilized. Hence this embodiment is effective when number of the components or elements 10 with leads is less than that of the leadless components 8.

As mentioned hereinabove, according to the embodiments of this invention, by means of the pilot pattern 7 melted solder 13 is led into the portion between the land 2 for a leadless element and the electrode 12 of the leadless element 8 where the evaporated gas or the air is apt to stay on solder dipping operation from the land 3 for elements with leads. Accordingly, the electrode 12 of the leadless element 8 is surely connected to the land and therefore the ratio of electric circuit of inferior quality is much decreased.

Having described specific embodiments of this invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A printed circuit board for mounting circuit elements to form an electric circuit thereon, said circuit board comprising:
   a substrate, a land covering at least part of said substrate,
   a first land portion without piercing hole for connecting with an electrode of a leadless component;
   a second land portion with a piercing hole for connecting with the lead wire of an element with leads; and
   a solder resist pattern leaving an exposed third land portion connecting said similarly exposed first and second land portions for leading melted solder therebetween.

2. A printed circuit board according to claim 1, wherein the width of said third land portion is narrower than that of said first land portion.

3. A printed circuit board according to claim 1, wherein said first land portion and said second land portion are connected to each other by a plurality of spaced narrow exposed third land portions.

4. A printed circuit board according to claim 1 or claim 2, wherein first land portions are connected to a single common second land portion through respective third land portions.

* * * * *